United States Patent
Nag et al.

(10) Patent No.: US 11,088,618 B2
(45) Date of Patent: Aug. 10, 2021

(54) PWM DC-DC CONVERTER WITH LINEAR VOLTAGE REGULATOR FOR DC ASSIST

(71) Applicant: Qorvo US, Inc., Greensboro, NC (US)

(72) Inventors: Manbir Singh Nag, Oak Ridge, NC (US); Michael R. Kay, Summerfield, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/122,611

(22) Filed: Sep. 5, 2018

(65) Prior Publication Data
US 2020/0076297 A1  Mar. 5, 2020

(51) Int. Cl.
| | |
|---|---|
| *H02M 3/156* | (2006.01) |
| *H02M 3/07* | (2006.01) |
| *H03K 7/08* | (2006.01) |
| *H03F 3/21* | (2006.01) |
| *H02M 1/00* | (2006.01) |

(52) U.S. Cl.
CPC .............. *H02M 3/156* (2013.01); *H02M 3/07* (2013.01); *H03F 3/21* (2013.01); *H03K 7/08* (2013.01); *H02M 2001/0003* (2013.01); *H02M 2001/0006* (2013.01); *H02M 2001/0045* (2013.01); *H03F 2200/451* (2013.01)

(58) Field of Classification Search
CPC ........ H02M 3/07; H02M 3/073; H02M 3/156; H02M 2001/0045; H02M 2003/072; H02M 2003/073; H02M 2003/075–078; H02M 2001/0003; H02M 2001/0006; H02M 1/44; H03K 7/08; H03F 3/21; H03F 2200/451
See application file for complete search history.

(56) References Cited

U.S. PATENT DOCUMENTS

| | | |
|---|---|---|
| 5,510,753 A | 4/1996 | French |
| 5,838,732 A | 11/1998 | Carney |
| 6,107,862 A * | 8/2000 | Mukainakano ......... H02M 3/07 327/536 |

(Continued)

FOREIGN PATENT DOCUMENTS

EP    3174199 A2 *   5/2017   ........... H03F 1/0227

OTHER PUBLICATIONS

Advisory Action for U.S. Appl. No. 15/986,948, dated Nov. 8, 2019, 3 pages.

(Continued)

*Primary Examiner* — Thienvu V Tran
*Assistant Examiner* — Shahzeb K Ahmad
(74) *Attorney, Agent, or Firm* — Withrow & Terranova, P.L.L.C.

(57) ABSTRACT

A DC power supply, which includes a DC-DC converter and a linear voltage regulator, is disclosed. The DC-DC converter provides a DC power supply signal and a duty-cycle signal, which is based on a duty-cycle of the DC-DC converter. The DC-DC converter provides the DC power supply signal via a power supply output using a setpoint of the DC power supply. The linear voltage regulator provides a DC assist signal to assist the DC-DC converter when an adjusted setpoint of the DC power supply is greater than a voltage of the DC power supply signal. The linear voltage regulator provides the adjusted setpoint using the setpoint and the duty-cycle signal, such that the adjusted setpoint is directly related to the setpoint and to the duty-cycle.

19 Claims, 8 Drawing Sheets

(56) References Cited

U.S. PATENT DOCUMENTS

| | | |
|---|---|---|
| 6,141,377 A | 10/2000 | Sharper et al. |
| 6,985,033 B1 | 1/2006 | Shirali et al. |
| 7,043,213 B2 | 5/2006 | Robinson et al. |
| 7,471,155 B1 | 12/2008 | Levesque |
| 7,570,931 B2 | 8/2009 | McCallister et al. |
| 7,994,862 B1 | 8/2011 | Pukhovski |
| 8,461,928 B2 | 6/2013 | Yahav et al. |
| 8,493,141 B2 | 7/2013 | Khlat et al. |
| 8,519,788 B2 | 8/2013 | Khlat |
| 8,588,713 B2 | 11/2013 | Khlat |
| 8,718,188 B2 | 5/2014 | Balteanu et al. |
| 8,725,218 B2 | 5/2014 | Brown et al. |
| 8,774,065 B2 | 7/2014 | Khlat et al. |
| 8,803,603 B2 | 8/2014 | Wimpenny |
| 8,818,305 B1 | 8/2014 | Schwent et al. |
| 8,854,129 B2 | 10/2014 | Wilson |
| 8,879,665 B2 | 11/2014 | Xia et al. |
| 8,913,690 B2 | 12/2014 | Onishi |
| 8,989,682 B2 | 3/2015 | Ripley et al. |
| 9,018,921 B2 | 4/2015 | Gurlahosur |
| 9,020,451 B2 | 4/2015 | Khlat |
| 9,041,364 B2 | 5/2015 | Khlat |
| 9,041,365 B2 | 5/2015 | Kay et al. |
| 9,055,529 B2 | 6/2015 | Shih |
| 9,065,509 B1 | 6/2015 | Yan et al. |
| 9,069,365 B2 | 6/2015 | Brown et al. |
| 9,098,099 B2 | 8/2015 | Park et al. |
| 9,166,538 B2 | 10/2015 | Hong et al. |
| 9,166,830 B2 | 10/2015 | Camuffo et al. |
| 9,167,514 B2 | 10/2015 | Dakshinamurthy et al. |
| 9,197,182 B2 | 11/2015 | Baxter et al. |
| 9,225,362 B2 | 12/2015 | Drogi et al. |
| 9,247,496 B2 | 1/2016 | Khlat |
| 9,263,997 B2 | 2/2016 | Vinayak |
| 9,270,230 B2 | 2/2016 | Henshaw et al. |
| 9,270,239 B2 | 2/2016 | Drogi et al. |
| 9,271,236 B2 | 2/2016 | Drogi |
| 9,280,163 B2 | 3/2016 | Kay et al. |
| 9,288,098 B2 | 3/2016 | Yan et al. |
| 9,298,198 B2 | 3/2016 | Kay et al. |
| 9,344,304 B1 | 5/2016 | Cohen |
| 9,356,512 B2 | 5/2016 | Chowdhury et al. |
| 9,377,797 B2 | 6/2016 | Kay et al. |
| 9,379,667 B2 | 6/2016 | Khlat et al. |
| 9,515,622 B2 | 12/2016 | Nentwig et al. |
| 9,520,907 B2 | 12/2016 | Peng et al. |
| 9,584,071 B2 | 2/2017 | Khlat |
| 9,595,869 B2 | 3/2017 | Lerdworatawee |
| 9,595,981 B2 | 3/2017 | Khlat |
| 9,596,110 B2 | 3/2017 | Jiang et al. |
| 9,614,477 B1 | 4/2017 | Rozenblit et al. |
| 9,634,666 B2 | 4/2017 | Krug |
| 9,748,845 B1 | 8/2017 | Kotikalapoodi |
| 9,806,676 B2 | 10/2017 | Balteanu et al. |
| 9,831,834 B2 | 11/2017 | Balteanu et al. |
| 9,837,962 B2 | 12/2017 | Mathe et al. |
| 9,923,520 B1 | 3/2018 | Abdelfattah et al. |
| 10,003,416 B1 | 6/2018 | Lloyd |
| 10,090,808 B1 | 10/2018 | Henzler et al. |
| 10,097,145 B1 | 10/2018 | Khlat et al. |
| 10,110,169 B2 | 10/2018 | Khesbak et al. |
| 10,158,329 B1 | 12/2018 | Khlat |
| 10,158,330 B1 | 12/2018 | Khlat |
| 10,170,989 B2 | 1/2019 | Balteanu et al. |
| 10,291,181 B2 | 5/2019 | Kim et al. |
| 10,326,408 B2 | 6/2019 | Khlat et al. |
| 10,382,071 B2 | 8/2019 | Rozek et al. |
| 10,476,437 B2 | 11/2019 | Nag et al. |
| 2002/0167827 A1* | 11/2002 | Umeda ................. H02M 3/07 363/59 |
| 2004/0266366 A1 | 12/2004 | Robinson et al. |
| 2005/0090209 A1 | 4/2005 | Behzad |
| 2005/0227646 A1 | 10/2005 | Yamazaki et al. |
| 2005/0232385 A1 | 10/2005 | Yoshikawa et al. |
| 2006/0240786 A1 | 10/2006 | Liu |
| 2007/0052474 A1 | 3/2007 | Saito |
| 2007/0258602 A1 | 11/2007 | Vepsalainen et al. |
| 2009/0016085 A1* | 1/2009 | Rader ..................... H02M 3/07 363/79 |
| 2009/0045872 A1 | 2/2009 | Kenington |
| 2009/0191826 A1 | 7/2009 | Takinami et al. |
| 2010/0308919 A1 | 12/2010 | Adamski et al. |
| 2011/0074373 A1* | 3/2011 | Lin ....................... H02M 3/156 323/282 |
| 2011/0136452 A1 | 6/2011 | Pratt et al. |
| 2011/0175681 A1 | 7/2011 | Inamori et al. |
| 2011/0279179 A1 | 11/2011 | Vice |
| 2012/0194274 A1 | 8/2012 | Fowers et al. |
| 2012/0200435 A1 | 8/2012 | Ngo et al. |
| 2012/0299645 A1 | 11/2012 | Southcombe et al. |
| 2012/0299647 A1 | 11/2012 | Honjo et al. |
| 2013/0021827 A1 | 1/2013 | Ye |
| 2013/0100991 A1 | 4/2013 | Woo |
| 2013/0130724 A1 | 5/2013 | Kumar Reddy et al. |
| 2013/0162233 A1* | 6/2013 | Marty .................. H02M 3/158 323/274 |
| 2013/0187711 A1 | 7/2013 | Goedken et al. |
| 2013/0200865 A1 | 8/2013 | Wimpenny |
| 2013/0271221 A1* | 10/2013 | Levesque ............. H03F 1/0261 330/294 |
| 2014/0009226 A1 | 1/2014 | Severson |
| 2014/0028370 A1 | 1/2014 | Wimpenny |
| 2014/0028390 A1 | 1/2014 | Davis |
| 2014/0057684 A1 | 2/2014 | Khlat |
| 2014/0103995 A1 | 4/2014 | Langer |
| 2014/0155002 A1 | 6/2014 | Dakshinamurthy et al. |
| 2014/0184335 A1 | 7/2014 | Nobbe et al. |
| 2014/0199949 A1 | 7/2014 | Nagode et al. |
| 2014/0210550 A1 | 7/2014 | Mathe et al. |
| 2014/0218109 A1 | 8/2014 | Wimpenny |
| 2014/0235185 A1 | 8/2014 | Drogi |
| 2014/0266423 A1 | 9/2014 | Drogi et al. |
| 2014/0266428 A1 | 9/2014 | Chiron et al. |
| 2014/0315504 A1 | 10/2014 | Sakai et al. |
| 2014/0361830 A1 | 12/2014 | Mathe et al. |
| 2014/0361837 A1 | 12/2014 | Strange et al. |
| 2015/0048883 A1 | 2/2015 | Vinayak |
| 2015/0071382 A1 | 3/2015 | Wu et al. |
| 2015/0098523 A1 | 4/2015 | Lim et al. |
| 2015/0155836 A1 | 6/2015 | Midya et al. |
| 2015/0188432 A1 | 7/2015 | Vannorsdel et al. |
| 2015/0236654 A1 | 8/2015 | Jiang et al. |
| 2015/0236729 A1 | 8/2015 | Peng et al. |
| 2015/0280652 A1 | 10/2015 | Cohen |
| 2015/0333781 A1 | 11/2015 | Alon et al. |
| 2016/0065137 A1 | 3/2016 | Khlat |
| 2016/0099687 A1 | 4/2016 | Khlat |
| 2016/0105151 A1 | 4/2016 | Langer |
| 2016/0118941 A1 | 4/2016 | Wang |
| 2016/0126900 A1 | 5/2016 | Shute |
| 2016/0173031 A1 | 6/2016 | Langer |
| 2016/0181995 A1 | 6/2016 | Nentwig et al. |
| 2016/0187627 A1 | 6/2016 | Abe |
| 2016/0197627 A1 | 7/2016 | Qin et al. |
| 2016/0226448 A1 | 8/2016 | Wimpenny |
| 2016/0294587 A1 | 10/2016 | Jiang et al. |
| 2017/0141736 A1 | 5/2017 | Pratt et al. |
| 2017/0302183 A1* | 10/2017 | Young .................. H02M 3/158 |
| 2017/0317913 A1 | 11/2017 | Kim et al. |
| 2017/0338773 A1 | 11/2017 | Balteanu et al. |
| 2018/0013465 A1 | 1/2018 | Chiron et al. |
| 2018/0048265 A1 | 2/2018 | Nentwig |
| 2018/0048276 A1 | 2/2018 | Khlat |
| 2018/0076772 A1 | 3/2018 | Khesbak et al. |
| 2018/0123453 A1* | 5/2018 | Puggelli ................. H02M 1/08 |
| 2018/0288697 A1 | 10/2018 | Camuffo et al. |
| 2018/0302042 A1 | 10/2018 | Zhang et al. |
| 2018/0309414 A1 | 10/2018 | Khlat et al. |
| 2018/0367101 A1 | 12/2018 | Chen et al. |
| 2019/0044480 A1 | 2/2019 | Khlat |
| 2019/0068234 A1 | 2/2019 | Khlat |
| 2019/0097277 A1* | 3/2019 | Fukae .................. H01M 10/44 |
| 2019/0109566 A1 | 4/2019 | Folkmann et al. |
| 2019/0109613 A1 | 4/2019 | Khlat et al. |

(56) References Cited

U.S. PATENT DOCUMENTS

| | | |
|---|---|---|
| 2019/0222175 A1 | 7/2019 | Khlat et al. |
| 2019/0222178 A1 | 7/2019 | Khlat et al. |
| 2019/0238095 A1 | 8/2019 | Khlat |
| 2019/0267956 A1 | 8/2019 | Granger-Jones et al. |
| 2020/0007090 A1 | 1/2020 | Khlat et al. |
| 2020/0036337 A1 | 1/2020 | Khlat |
| 2020/0153394 A1 | 5/2020 | Khlat et al. |
| 2020/0177131 A1 | 6/2020 | Khlat |

OTHER PUBLICATIONS

Notice of Allowance for U.S. Appl. No. 15/986,948, dated Dec. 13, 2019, 7 pages.
Advisory Action for U.S. Appl. No. 16/018,426, dated Nov. 19, 2019, 3 pages.
Notice of Allowance for U.S. Appl. No. 16/180,887, dated Jan. 13, 2020, 8 pages.
Notice of Allowance for U.S. Appl. No. 15/888,300, dated Jan. 14, 2020, 11 pages.
Final Office Action for U.S. Appl. No. 15/888,300, dated Feb. 15, 2019, 15 pages.
Non-Final Office Action for U.S. Appl. No. 151986,948, dated Mar. 28, 2019, 8 pages.
Non-Final Office Action for U.S. Appl. No. 16/018,426, dated Apr. 11, 2019, 11 pages.
Supplemental Notice of Allowability for U.S. Appl. No. 15/902,244, dated Mar. 20, 2019, 6 pages.
Notice of Allowance for U.S. Appl. No. 15/902,244, dated Feb. 8, 2019, 8 pages.
Pfister, Henry, "Discrete-Time Signal Processing," Lecture Note, pfisteree.duke.edu/coursestece485/dtsp.pdf, Mar. 3, 2017, 22 pages.
Advisory Action for U.S. Appl. No. 15/888,300, dated Jun. 5, 2019, 3 pages.
Non-Final Office Action for U.S. Appl. No. 15/888,260, dated May 2, 2019, 14 pages.
Notice of Allowance for U.S. Appl. No. 15/984,566, dated May 21, 2019, 6 pages.
Notice of Allowance for U.S. Appl. No. 15/792,909, dated Dec. 19, 2018, 11 pages.
Notice of Allowance for U.S. Appl. No. 15/993,705, dated Oct. 31, 2018, 7 pages.
Non-Final Office Action for U.S. Appl. No. 14/836,634, dated May 16, 2016, 9 pages.
Non-Final Office Action for U.S. Appl. No. 14/868,890, dated Jul. 14, 2016, 13 pages.
Non-Final Office Action for U.S. Appl. No. 15/792,909, dated May 18, 2018, 13 pages.
Notice of Allowance for U.S. Appl. No. 151459,449, dated Mar. 28, 2018, 7 pages.
Notice of Allowance for U.S. Appl. No. 15/723,460, dated Jul. 24, 2018, 8 pages.
Notice of Allowance for U.S. Appl. No. 151704,131, dated Jul. 17, 2018, 7 pages.
Notice of Allowance for U.S. Appl. No. 15/728,202, dated Aug. 2, 2018, 7 pages.
Non-Final Office Action for U.S. Appl. No. 15/888,300, dated Aug. 28, 2018, 11 pages.
Notice of Allowance for U.S. Appl. No. 16/150,556, dated Jul. 29, 2019, 7 pages.
Non-Final Office Action for U.S. Appl. No. 15/888,300, dated Jun. 27, 2019, 17 pages.
Final Office Action for U.S. Appl. No. 15/986,948, dated Aug. 27, 2019, 9 pages.
Final Office Action for U.S. Appl. No. 16/018,426, dated Sep. 4, 2019, 12 pages.
Corrected Notice of Allowability for U.S. Appl. No. 15/888,300, dated Feb. 25, 2020, 7 pages.
Notice of Allowance for U.S. Appl. No. 16/018,426, dated Mar. 31, 2020, 7 pages.
Non-Final Office Action for U.S. Appl. No. 16/174,535, dated Feb. 4, 2020, 7 pages.
Quayle Action for U.S. Appl. No. 16/354,234, mailed Mar. 6, 2020, 8 pages.
Notice of Allowance for U.S. Appl. No. 16/155,127, dated Jun. 1, 2020, 8 pages.
Corrected Notice of Allowability for U.S. Appl. No. 15/888,300, dated May 13, 2020, 7 pages.
Non-Final Office Action for U.S. Appl. No. 16/246,859, dated Apr. 28, 2020, 9 pages.
Notice of Allowance for U.S. Appl. No. 16/354,234, dated Apr. 24, 2020, 9 pages.
Final Office Action for U.S. Appl. No. 16/174,535, dated Jul. 1, 2020, 7 pages.
Notice of Allowance for U.S. Appl. No. 16/246,859, dated Sep. 18, 2020, 8 pages.
Non-Final Office Action for U.S. Appl. No. 16/284,023, dated Jun. 24, 2020, 7 pages.
Non-Final Office Action for U.S. Appl. No. 16/435,940, dated Jul. 23, 2020, 6 pages.
Advisory Action for U.S. Appl. No. 16/174,535, dated Sep. 24, 2020, 3 pages.
Notice of Allowance for U.S. Appl. No. 16/174,535, dated Oct. 29, 2020, 7 pages.
Final Office Action for U.S. Appl. No. 16/284,023, dated Nov. 3, 2020, 7 pages.
Quayle Action for U.S. Appl. No. 16/421,905, mailed Aug. 25, 2020, 5 pages.
Non-Final Office Action for U.S. Appl. No. 16/416,812, dated Oct. 16, 2020, 8 pages.
Non-Final Office Action for U.S. Appl. No. 161514,051, dated Nov. 13, 2020, 9 pages.
Non-Final Office Action for U.S. Appl. No. 16/774,060, dated Aug. 17, 2020, 6 pages.
Quayle Action for U.S. Appl. No. 16/589,940, dated Dec. 4, 2020, 8 pages.
Notice of Allowance for U.S. Appl. No. 16/284,023, dated Jan. 19, 2021, 7 pages.
Notice of Allowance for U.S. Appl. No. 16/416,812, dated Feb. 16, 2021, 8 pages.
Non-Final Office Action for U.S. Appl. No. 16/689,236 dated Mar. 2, 2021, 15 pages.
Notice of Allowance for U.S. Appl. No. 16/435,940, dated Dec. 21, 2020, 7 pages.
Notice of Allowance for U.S. Appl. No. 16/774,060, dated Feb. 3, 2021, 7 pages.
Notice of Allowance for U.S. Appl. No. 16/590,790, dated Jan. 27, 2021, 7 pages.
Notice of Allowance for U.S. Appl. No. 16/661,061, dated Feb. 10, 2021, 7 pages.
Notice of Allowance for U.S. Appl. No. 16/689,236 dated Jun. 9, 2021, 7 pages.
Non-Final Office Action for U.S. Appl. No. 16/775,554, dated Jun. 14, 2021, 5 pages.
Non-Final Office Action for U.S. Appl. No. 16/582,471, dated Mar. 24, 2021, 11 pages.
Non-Final Office Action for U.S. Appl. No. 16/597,952, dated May 26, 2021, 7 pages.
Notice of Allowance for U.S. Appl. No. 16/582,471, dated Jun. 22, 2021, 9 pages.
Notice of Allowance for U.S. Appl. No. 16/834,049, dated Jun. 24, 2021, 8 pages.

* cited by examiner

PWM DC-DC CONVERTER WITH LINEAR VOLTAGE REGULATOR FOR DC ASSIST

FIELD OF THE DISCLOSURE

The present invention relates to pulse width modulation (PWM) direct current (DC)-DC converters, which may be used in radio frequency (RF) communications systems.

BACKGROUND

Traditional $2^{nd}$ generation (2G) global system for mobile communications (GSM) cellphones, or other user equipment, may typically be battery powered using traditional high-power, high current, low-cost, and low drop-out (LDO) regulators. However, in applications having high efficiency requirements, linear DC power supplies may be inadequate because the efficiency of a linear voltage regulator degrades dramatically the more the linear regulator output voltage is below the battery voltage. As a result, a DC power supply, which includes a DC-DC converter and a linear voltage regulator, may be preferred. The linear voltage regulator may provide high output current when the output voltage approaches the battery voltage, and the DC-DC converter may provide high efficiency when the battery voltage is greater than the output voltage. In this regard, a 2G GSM cellphone may benefit from such a power supply. In general, for 2G cellular applications there is a need for a DC power supply having a combination of a DC-DC converter and a linear voltage regulator.

SUMMARY

A DC power supply, which includes a DC-DC converter and a linear voltage regulator, is disclosed according to one embodiment of the present disclosure. The DC-DC converter provides a DC power supply signal to a load via a power supply output and a duty-cycle signal, which is based on the load. The linear voltage regulator provides assistance to the DC-DC converter when the DC-DC converter is incapable of supplying the load by itself.

In this regard, the DC power supply operates in either a normal mode or an assist mode. The normal mode is selected when the DC-DC converter is capable of supplying the load by itself. As such, during the normal mode, the DC-DC converter provides the duty-cycle signal to place the linear voltage regulator in a stand-by mode and supplies power to the load by itself.

Conversely, the assist mode is selected when DC-DC converter needs assistance from the linear voltage regulator.

In an example embodiment of the present disclosure, the normal mode is selected when an output voltage from the DC power supply is between 300 and 400 millivolts below a battery voltage.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
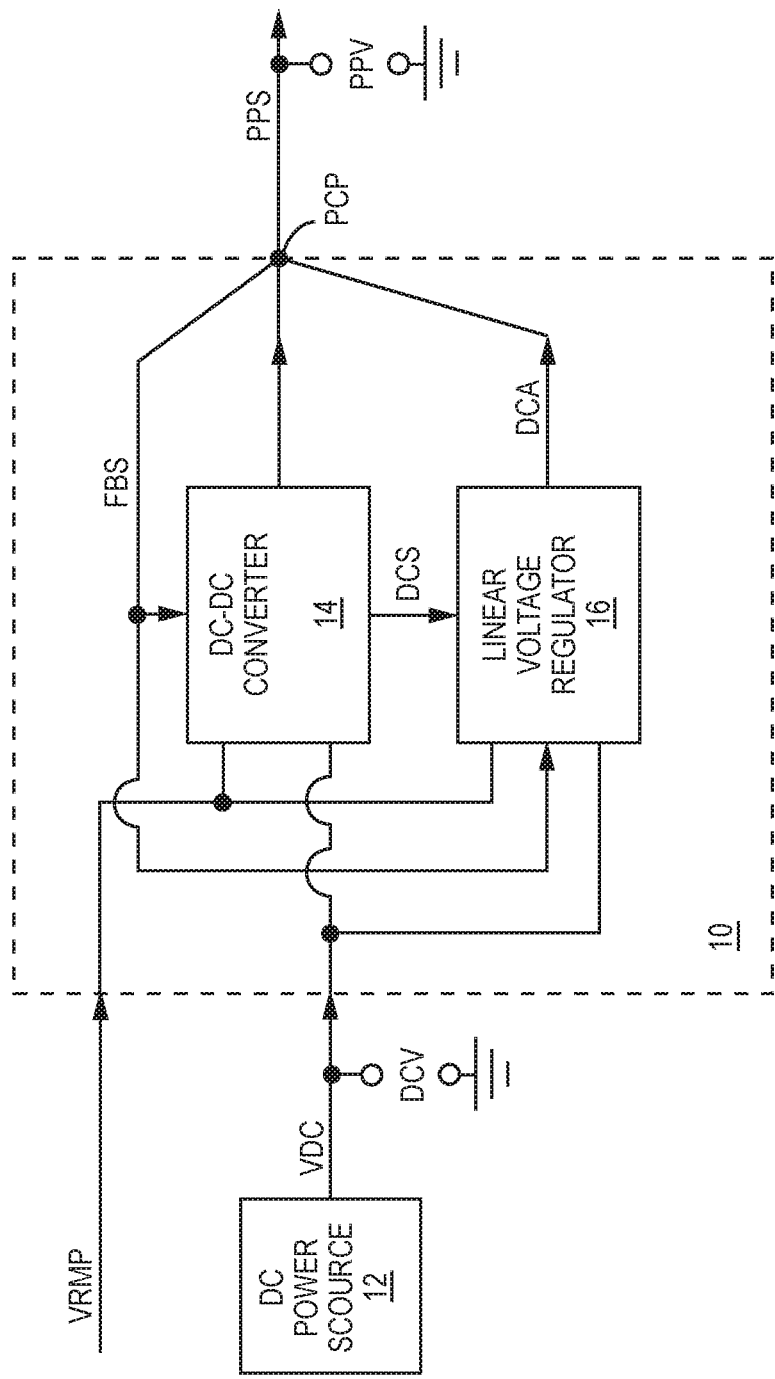
FIG. 1 shows a DC power supply according to one embodiment of the DC power supply.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

A DC power supply, which includes a DC-DC converter and a linear voltage regulator, is disclosed according to one embodiment of the present disclosure. The DC-DC converter provides a DC power supply signal to a load via a power supply output and a duty-cycle signal, which is based on the load. The linear voltage regulator provides assistance to the DC-DC converter when the DC-DC converter is incapable of supplying the load by itself.

In this regard, the DC power supply operates in either a normal mode or an assist mode. The normal mode is selected when the DC-DC converter is capable of supplying the load by itself. As such, during the normal mode, the DC-DC converter provides the duty-cycle signal to place the linear voltage regulator in a stand-by mode and supplies power to the load by itself. Conversely, the assist mode is selected when DC-DC converter needs assistance from the linear voltage regulator.

In an example embodiment of the present disclosure, the normal mode is selected when an output voltage from the DC power supply is between 300 and 400 millivolts below a battery voltage.

FIG. 1 shows a DC power supply 10 and a DC power source 12 according to one embodiment of the DC power supply 10 and the DC power source 12. In one embodiment of the DC power source 12, the DC power source 12 is a battery. The DC power source 12 provides a DC source signal VDC to the DC power supply 10. The DC source signal VDC has a DC source voltage DCV. In addition, the DC power supply 10 has a power supply output PCP. The DC power supply 10 provides a DC power supply signal PPS via the power supply output PCP using the DC source signal VDC. The DC power supply signal PPS has a DC power supply voltage PPV. In addition, the DC power supply 10 provides the DC power supply signal PPS using a setpoint of the DC power supply 10.

The DC power supply 10 includes a DC-DC converter 14 and a linear voltage regulator 16. In one embodiment of the DC-DC converter 14, the DC-DC converter 14 functions as a switching power supply, such that the DC-DC converter 14 has a duty-cycle. In one embodiment of the linear voltage regulator 16, the linear voltage regulator 16 functions as an analog power supply. In one embodiment of the DC-DC converter 14 and the linear voltage regulator 16, the DC-DC converter 14 provides power more efficiently than the linear voltage regulator 16, such that an efficiency of the DC-DC converter 14 is greater than an efficiency of the linear voltage regulator 16. Each of the DC-DC converter 14 and the linear voltage regulator 16 receives a power supply control signal VRMP, which is representative of the setpoint of the DC power supply 10.

In one embodiment of the linear voltage regulator 16, when the DC source voltage DCV minus the setpoint of the DC power supply 10 is greater than a voltage threshold, the DC-DC converter 14 disables the DC assist signal DCA to reduce power output of the linear voltage regulator 16. In a first embodiment of the voltage threshold, the voltage threshold is equal to 150 millivolts. In a second embodiment of the voltage threshold, the voltage threshold is equal to 250 millivolts. In a third embodiment of the voltage threshold, the voltage threshold is equal to 350 millivolts. In a fourth embodiment of the voltage threshold, the voltage threshold is equal to 450 millivolts. In a fifth embodiment of the voltage threshold, the voltage threshold is equal to 550 millivolts.

In one embodiment of the DC-DC converter 14, the DC-DC converter 14 provides the DC power supply signal PPS using the DC source signal VDC and using the setpoint of the DC power supply 10. In one embodiment of the linear voltage regulator 16, the linear voltage regulator 16 provides a DC assist signal DCA to assist the DC-DC converter 14 using the DC source signal VDC. As such, the DC power source 12 provides the DC source signal VDC to both the DC-DC converter 14 and the linear voltage regulator 16. The DC-DC converter 14 provides the DC power supply signal PPS via the power supply output PCP and the linear voltage regulator 16 provides the DC assist signal DCA via the power supply output PCP.

Each of the DC-DC converter 14 and the linear voltage regulator 16 receives a feedback signal FBS via the power supply output PCP. As such, the feedback signal FBS is representative of the DC power supply signal PPS. The DC-DC converter 14 further provides a duty-cycle signal DCS to the linear voltage regulator 16 based on the duty-cycle of the DC-DC converter 14. In one embodiment of the linear voltage regulator 16, the linear voltage regulator 16 provides the DC assist signal DCA to assist the DC-DC converter 14 via the power supply output PCP when an adjusted setpoint is greater than the DC power supply voltage PPV. In addition, the linear voltage regulator 16 provides the adjusted setpoint of the DC power supply 10 using the setpoint and the duty-cycle signal DCS, such that the adjusted setpoint is directly related to the setpoint and directly related to the duty-cycle of the DC-DC converter 14. In an alternate embodiment of the linear voltage regulator 16, the linear voltage regulator 16 provides the DC assist signal DCA to assist the DC-DC converter 14 via the power supply output PCP when an adjusted setpoint is within an assist range of the DC power supply signal PPS.

In one embodiment of the DC-DC converter 14 and the linear voltage regulator 16, when the duty-cycle of the DC-DC converter 14 is less than a maximum duty-cycle, the adjusted setpoint is less than the setpoint. In one embodiment of the DC-DC converter 14 and the linear voltage regulator 16, the maximum duty-cycle is equal to 100 percent. In one embodiment of the DC-DC converter 14 and the linear voltage regulator 16, when the duty-cycle of the DC-DC converter 14 is essentially equal to the maximum duty-cycle, the adjusted setpoint is essentially equal to the setpoint. In an exemplary embodiment of the DC-DC converter 14, when the duty-cycle of the DC-DC converter 14 is equal to zero, a portion of the DC power supply voltage PPV that is provided by the DC-DC converter 14 is equal to essentially zero volts. When the duty-cycle of the DC-DC converter 14 is equal to 100 percent, the portion of the DC power supply voltage PPV that is provided by the DC-DC converter 14 is equal to essentially the DC source voltage DCV. When the duty-cycle is between zero and 100 percent, the portion of the DC power supply voltage PPV that is provided by the DC-DC converter 14 varies based on the duty-cycle signal DCS. In this regard, the adjusted setpoint is used to control the assistance that is provided by the linear voltage regulator 16.

Figure 2:
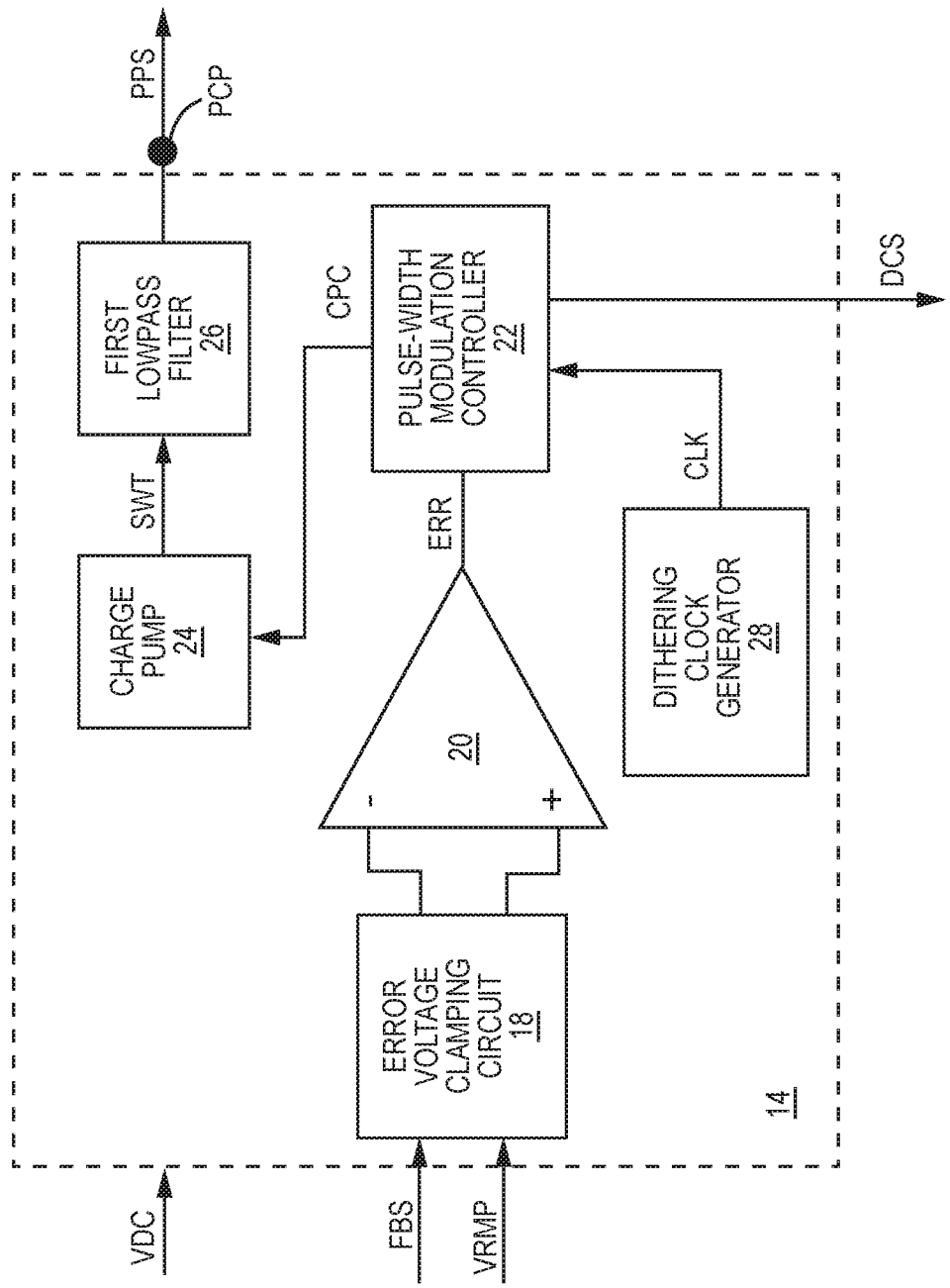
FIG. 2 shows details of a DC-DC converter illustrated in FIG. 1 according to one embodiment of the DC-DC converter.

FIG. 2 shows details of the DC-DC converter 14 illustrated in FIG. 1 according to one embodiment of the DC-DC converter 14. The DC-DC converter 14 includes an error voltage clamping circuit 18, a converter error amplifier 20, a pulse-width modulation controller 22, a charge pump 24, a first lowpass filter 26, and a dithering clock generator 28. The converter error amplifier 20 receives the power supply control signal VRMP and the feedback signal FBS via the error voltage clamping circuit 18. As such, the converter error amplifier 20 provides an error signal ERR based on a difference between the power supply control signal VRMP and the feedback signal FBS.

In general, the DC-DC converter 14 provides the DC power supply signal PPS using the error signal ERR. Since the feedback signal FBS is based on the DC power supply signal PPS and since the power supply control signal VRMP is representative of the setpoint of the DC power supply 10, the error signal ERR is indicative of the accuracy of the DC power supply signal PPS with respect to the setpoint of the DC power supply 10.

The error signal ERR is used to control the pulse-width modulation controller 22, which provides a charge pump control signal CPC based on the error signal ERR and a clock signal CLK, which is provided by the dithering clock generator 28. The charge pump control signal CPC is used to control the charge pump 24. In this regard, in one embodiment of the pulse-width modulation controller 22, a frequency of the charge pump control signal CPC is based on the frequency of the clock signal CLK. In one embodiment of the DC-DC converter 14, the dithering clock generator 28 dithers a frequency of the clock signal CLK to dither a frequency of the charge pump control signal CPC and a frequency of the duty-cycle signal DCS. Dithering the frequency of the charge pump control signal CPC dithers a frequency of a switching output signal SWT. Dithering the frequency of the switching output signal SWT may reduce output noise of the DC-DC converter 14.

However, in one embodiment of the pulse-width modulation controller 22, when the error signal ERR has a constant maximum value, the charge pump control signal CPC has a constant maximum value. Conversely, when the error signal ERR has a constant minimum value, the charge pump control signal CPC has a constant minimum value. Otherwise, a frequency of the charge pump control signal CPC is based on the frequency of the clock signal CLK, such that a duty-cycle of the charge pump control signal CPC is based on the error signal ERR. In addition, the pulse-width modulation controller 22 provides the duty-cycle signal DCS, such that the duty-cycle of the duty-cycle signal DCS is based on the duty-cycle of the charge pump control signal CPC.

The error voltage clamping circuit 18 is coupled to inputs to the converter error amplifier 20. The error voltage clamping circuit 18 receives the power supply control signal VRMP and the feedback signal FBS and limits the difference between the power supply control signal VRMP and the feedback signal FBS that is presented to the converter error amplifier 20. By limiting the difference between the power supply control signal VRMP and the feedback signal FBS presented to the converter error amplifier 20, the error voltage clamping circuit 18 allows fast recovery of the DC-DC converter 14 when the difference between the power supply control signal VRMP and the feedback signal FBS is large.

The charge pump 24 receives the charge pump control signal CPC and provides the switching output signal SWT based on the charge pump control signal CPC. The charge pump 24 includes at least one energy storage element, such as one or more capacitive element. The first lowpass filter 26 receives and filters the switching output signal SWT to provide the DC power supply signal PPS.

Figure 3:
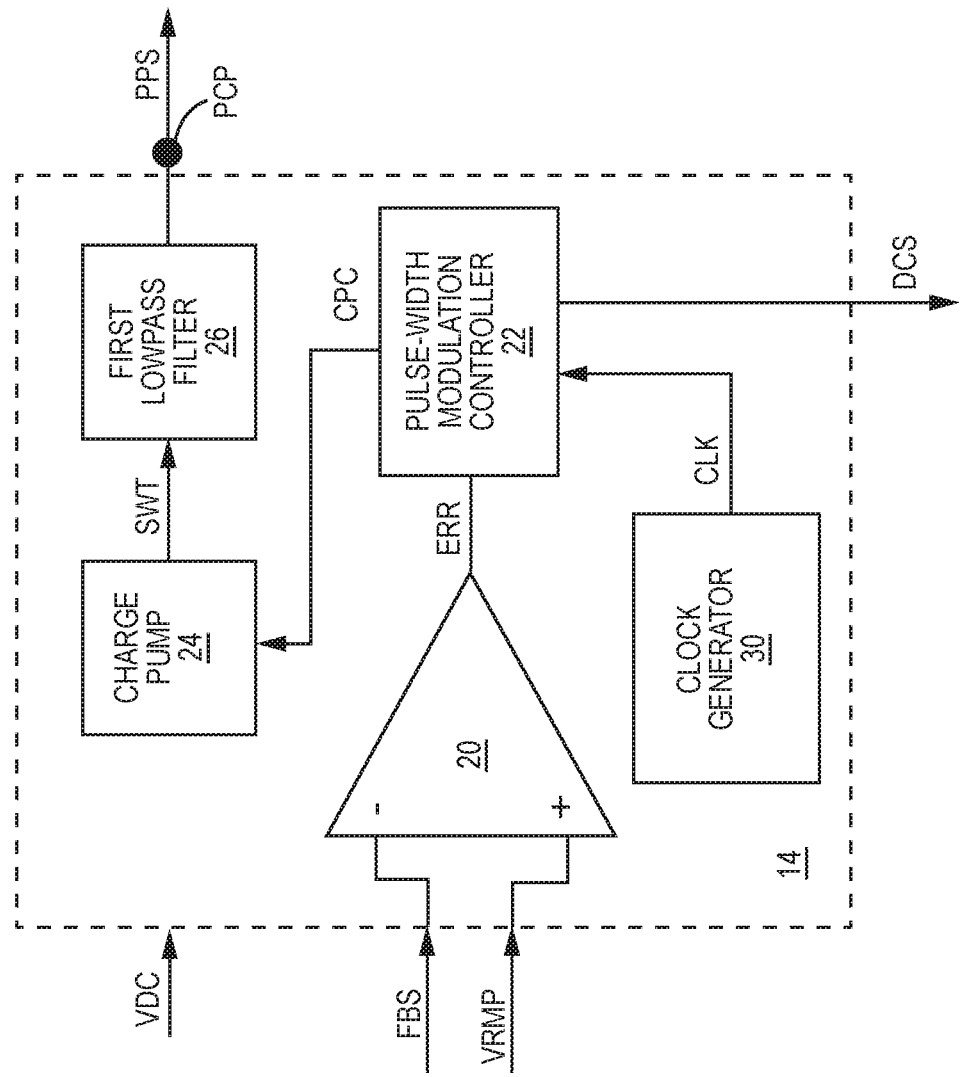
FIG. 3 shows details of the DC-DC converter illustrated in FIG. 1 according to an alternate embodiment of the DC-DC converter.

FIG. 3 shows details of the DC-DC converter 14 illustrated in FIG. 1 according to an alternate embodiment of the DC-DC converter 14. The DC-DC converter 14 illustrated in FIG. 3 is similar to the DC-DC converter 14 illustrated in FIG. 2, except in the DC-DC converter 14 illustrated in FIG. 3, the error voltage clamping circuit 18 is omitted and the dithering clock generator 28 is replaced with a clock generator 30, such that the frequency of the clock signal CLK is not dithered. As such, the frequency of the charge pump control signal CPC is not dithered and the frequency of the duty-cycle signal DCS is not dithered. By omitting the error voltage clamping circuit 18, recovery time may be unacceptably long when the difference between the power supply control signal VRMP and the feedback signal FBS is large.

Figure 4:
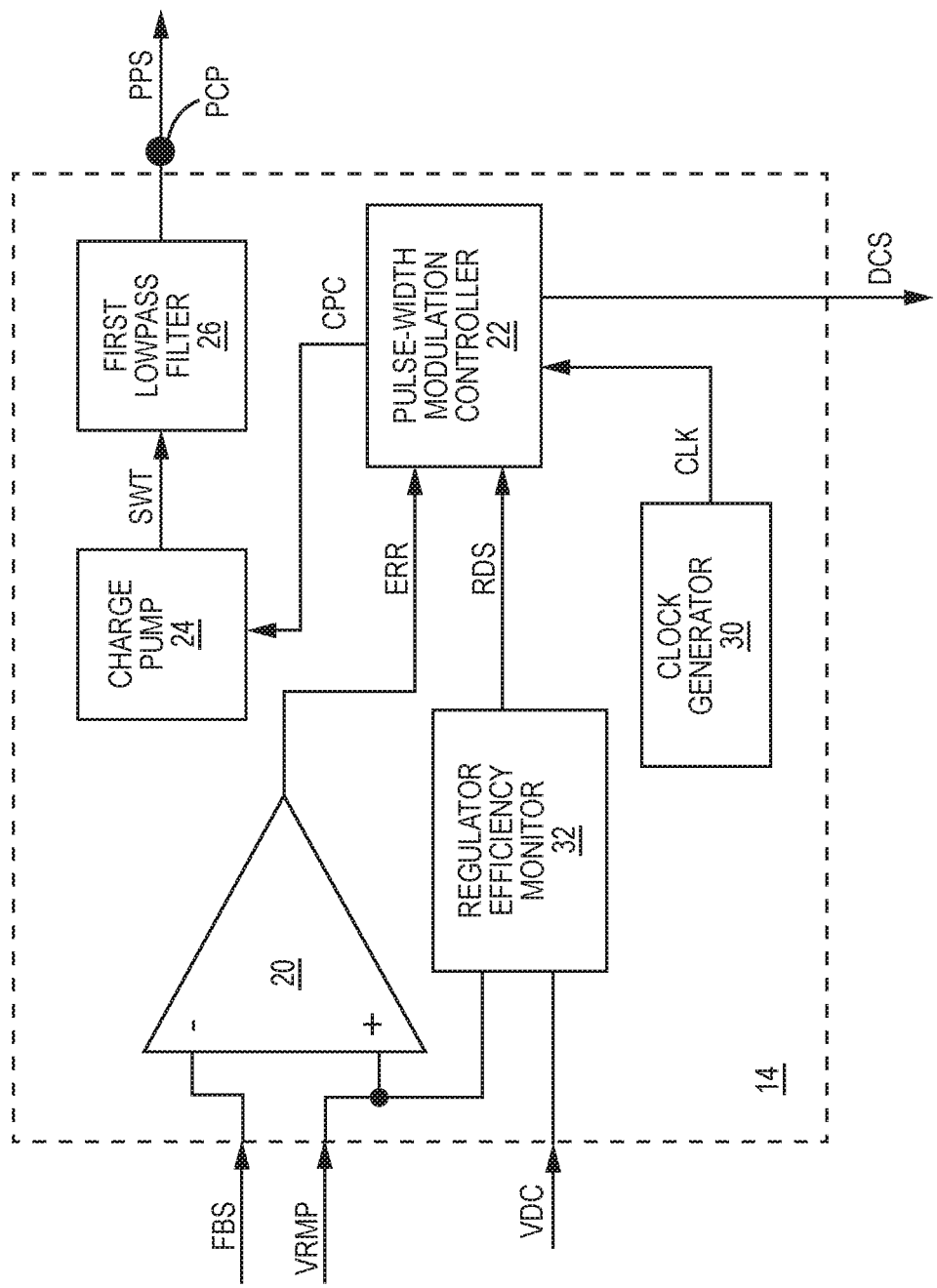
FIG. 4 shows details of the DC-DC converter illustrated in FIG. 1 according to an additional embodiment of the DC-DC converter.

FIG. 4 shows details of the DC-DC converter 14 illustrated in FIG. 1 according to an additional embodiment of the DC-DC converter 14. The DC-DC converter 14 illustrated in FIG. 4 is similar to the DC-DC converter 14 illustrated in FIG. 3, except the DC-DC converter 14 illustrated in FIG. 4 further includes a regulator efficiency monitor 32. The regulator efficiency monitor 32 receives the power supply control signal VRMP and the DC source signal VDC. The regulator efficiency monitor 32 provides a regulator disable signal RDS to the pulse-width modulation controller 22 based on a difference between the DC source voltage DCV (FIG. 1) and the power supply control signal VRMP. In this regard, when the setpoint for the DC power supply voltage PPV (FIG. 1) is significantly less than the DC source voltage DCV (FIG. 1), the regulator efficiency monitor 32 disables the linear voltage regulator 16 (FIG. 1) using the regulator disable signal RDS. As such, the pulse-width modulation controller 22 disables the linear voltage regulator 16 (FIG. 1) via the duty-cycle signal DCS based on the regulator disable signal RDS.

In one embodiment of the DC-DC converter 14, when the setpoint for the DC power supply voltage PPV (FIG. 1) is at least 350 millivolts less than the DC source voltage DCV (FIG. 1), the regulator efficiency monitor 32 disables the linear voltage regulator 16 (FIG. 1) using the regulator disable signal RDS. In one embodiment of the DC-DC converter 14, when the setpoint for the DC power supply voltage PPV (FIG. 1) is at least 400 millivolts less than the DC source voltage DCV (FIG. 1), the regulator efficiency monitor 32 disables the linear voltage regulator 16 (FIG. 1) using the regulator disable signal RDS.

Figure 5:
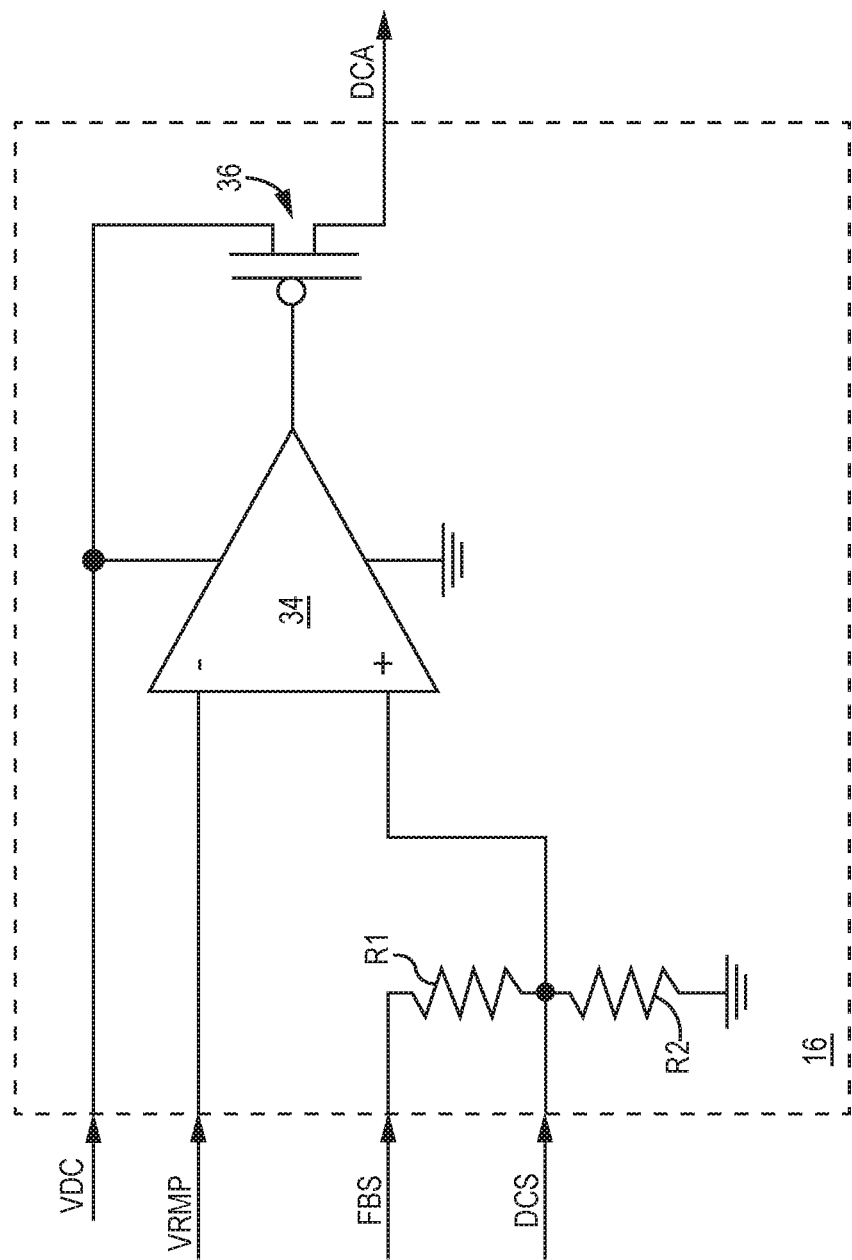
FIG. 5 shows details of a linear voltage regulator illustrated in FIG. 1 according to one embodiment of the linear voltage regulator.

FIG. 5 shows details of the linear voltage regulator 16 illustrated in FIG. 1 according to one embodiment of the linear voltage regulator 16. The linear voltage regulator 16 illustrated in FIG. 5 includes an error amplifier 34, a P-type field effect transistor (PFET) 36, a first resistive element R1, and a second resistive element R2. The DC power source 12 (FIG. 1) provides the DC source signal VDC (FIG. 1) to the error amplifier 34 and to a source of the PFET 36. An inverting input of the error amplifier 34 receives the power supply control signal VRMP (FIG. 1). The first resistive element R1 is coupled between a non-inverting input to the error amplifier 34 and the power supply output PCP (FIG. 1). The second resistive element R2 is coupled between the non-inverting input to the error amplifier 34 and ground.

The error amplifier 34 receives the duty-cycle signal DCS via the non-inverting input to the error amplifier 34. In one embodiment of the duty-cycle signal DCS, the duty-cycle signal DCS is a current signal, such that a magnitude of the duty-cycle signal DCS is inversely related to the duty-cycle of the DC-DC converter 14.

An output from the error amplifier 34 is coupled to a gate of the PFET 36. The linear voltage regulator 16 provides the DC assist signal DCA via a drain of the PFET 36. The PFET 36 provides an open-drain output of the linear voltage regulator 16, such that the open-drain output of the linear voltage regulator 16 is coupled to the power supply output PCP (FIG. 1). The linear voltage regulator 16 provides the DC assist signal DCA via the open-drain output of the linear voltage regulator 16. The PFET 36 is coupled between the error amplifier 34 and the power supply output PCP (FIG. 1). The linear voltage regulator 16 provides the DC assist signal DCA via the error amplifier 34 and the PFET 36.

Figure 6:
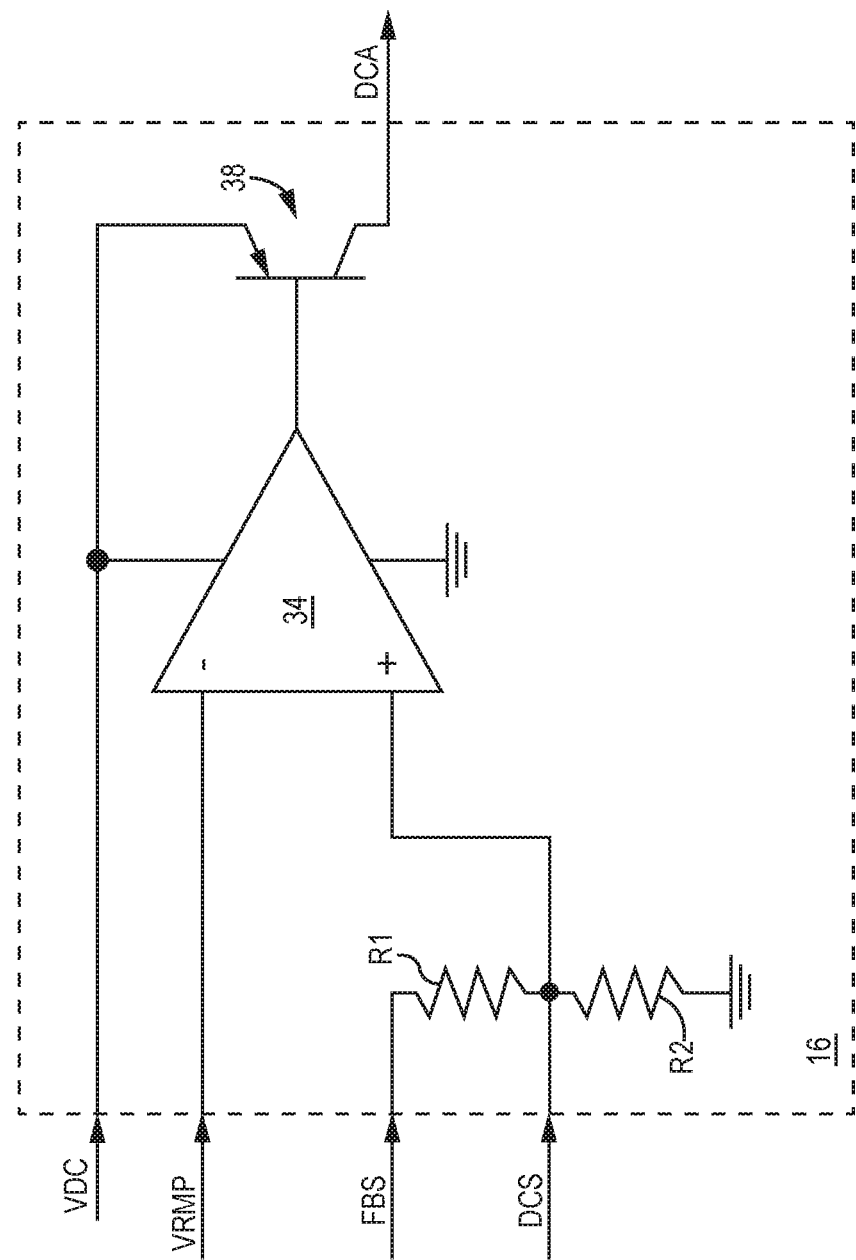
FIG. 6 shows details of the linear voltage regulator illustrated in FIG. 1 according to an alternate embodiment of the linear voltage regulator.

FIG. 6 shows details of the linear voltage regulator 16 illustrated in FIG. 1 according to an alternate embodiment of the linear voltage regulator 16. The linear voltage regulator 16 illustrated in FIG. 6 is similar to the linear voltage regulator 16 illustrated in FIG. 5, except the linear voltage regulator 16 illustrated in FIG. 6 includes a PNP bipolar junction transistor (BJT) 38 instead of the PFET 36 (FIG. 5).

In this regard, the DC power source 12 (FIG. 1) provides the DC source signal VDC (FIG. 1) to the error amplifier 34 and to an emitter of the PNP BJT 38. An output from the error amplifier 34 is coupled to a base of the PNP BJT 38. The linear voltage regulator 16 provides the DC assist signal DCA via a collector of the PNP BJT 38. The PNP BJT 38 provides an open-collector output of the linear voltage regulator 16, such that the open-collector output of the linear voltage regulator 16 is coupled to the power supply output PCP (FIG. 1). The linear voltage regulator 16 provides the DC assist signal DCA via the open-collector output of the linear voltage regulator 16. The PNP BJT 38 is coupled between the error amplifier 34 and the power supply output PCP (FIG. 1). The linear voltage regulator 16 provides the DC assist signal DCA via the error amplifier 34 and the PNP BJT 38.

Figure 7:
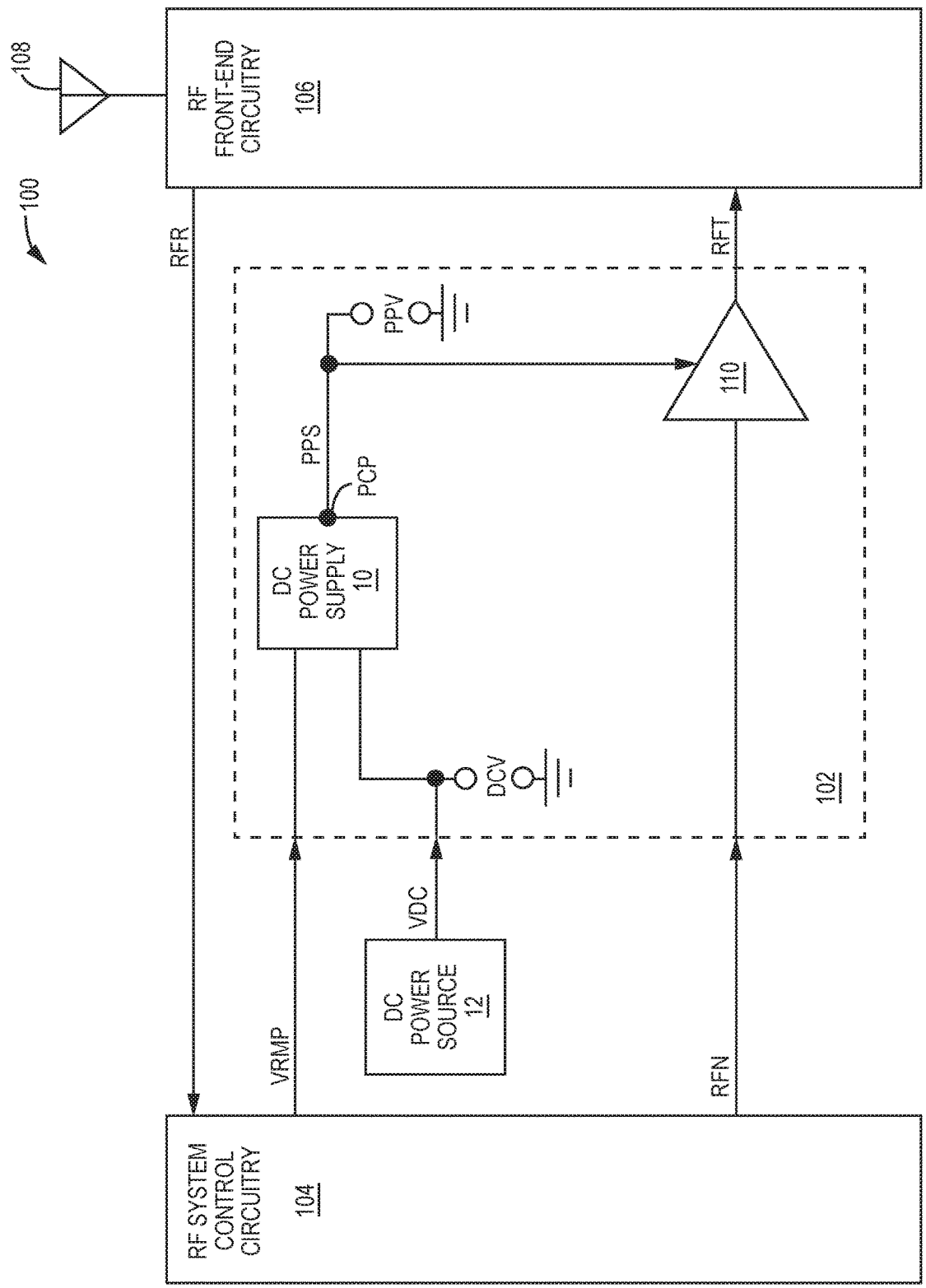
FIG. 7 shows an RF communications system according to one embodiment of the RF communications system.

FIG. 7 shows an RF communications system 100 according to one embodiment of the present disclosure. The RF communications system 100 includes RF transmitter circuitry 102, RF system control circuitry 104, RF front-end circuitry 106, an RF antenna 108, and the DC power source 12. The RF transmitter circuitry 102 includes an RF PA 110 and the DC power supply 10.

In one embodiment of the RF communications system 100, the RF front-end circuitry 106 receives via the RF antenna 108, processes, and forwards an RF receive signal RFR to the RF system control circuitry 104. The RF system control circuitry 104 provides the power supply control signal VRMP to the DC power supply 10. The RF system control circuitry 104 provides an RF input signal RFN to the RF PA 110. In this regard, the RF system control circuitry 104 provides the setpoint of the DC power supply 10 using the power supply control signal VRMP.

The DC power supply 10 provides power to the RF PA 110 using the DC power supply signal PPS. The DC power supply signal PPS has the DC power supply voltage PPV. In one embodiment of the power supply control signal VRMP, the power supply control signal VRMP is representative of a setpoint of the DC power supply signal PPS. The RF PA 110 receives and amplifies the RF input signal RFN to provide an RF transmit signal RFT using the DC power supply signal PPS. In one embodiment of the DC power supply 10, the DC power supply 10 provides power for amplification via the DC power supply signal PPS. The RF front-end circuitry 106 receives, processes, and transmits the RF transmit signal RFT via the RF antenna 108.

In one embodiment of the RF PA 110, the RF transmit signal RFT is amplitude modulated, such that the RF transmit signal RFT has an envelope. In one embodiment of the DC power supply 10, the DC power supply 10 modulates the DC power supply signal PPS to at least partially track the envelope of the RF transmit signal RFT, thereby providing envelope tracking. As such, in one embodiment of the RF system control circuitry 104, the RF system control circuitry 104 uses the power supply control signal VRMP to modulate the DC power supply signal PPS. In one embodiment of the RF transmit signal RFT, the RF transmit signal RFT is a second generation wireless telephone transmit signal.

Figure 8:
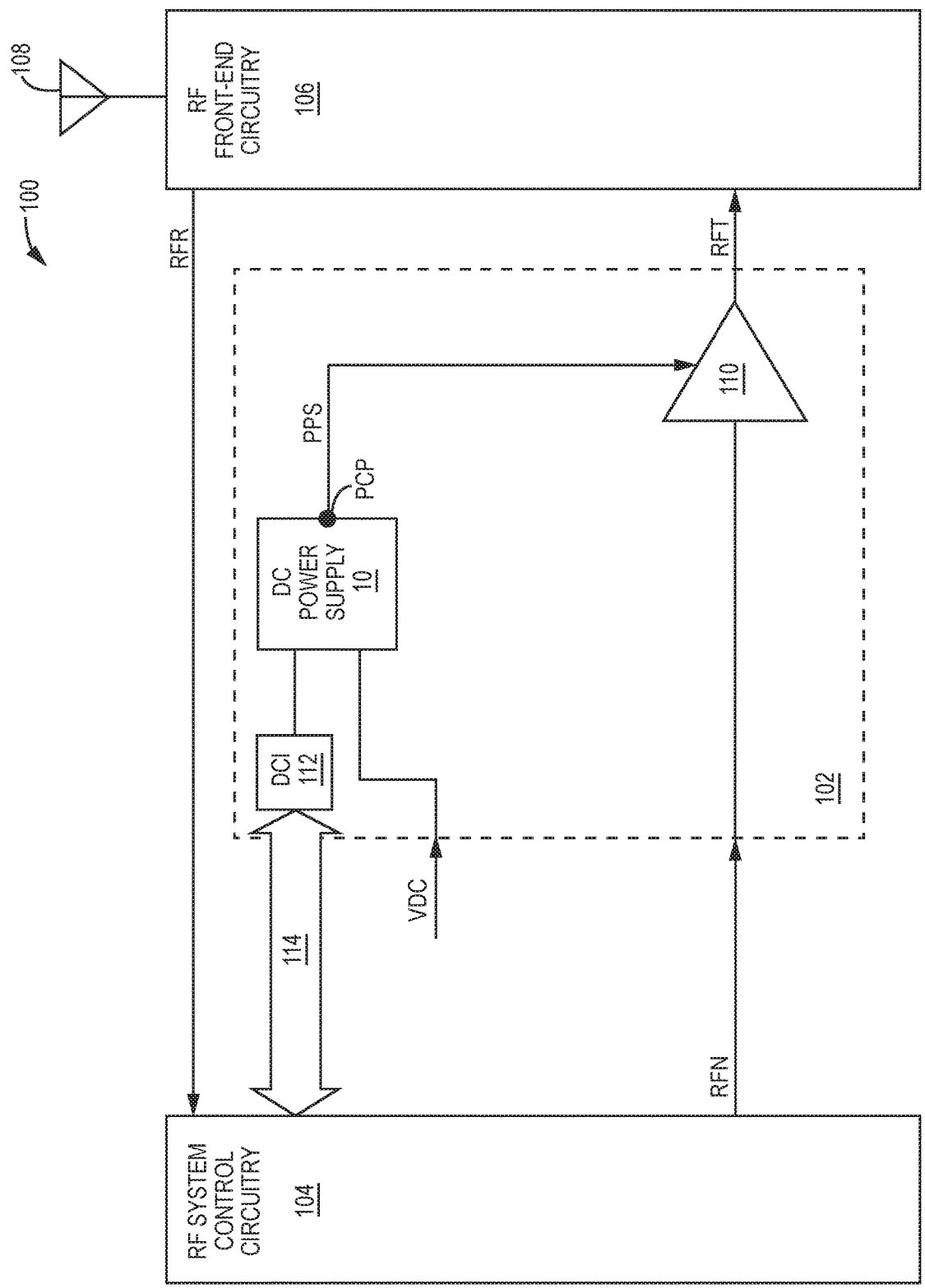
FIG. 8 shows the RF communications system according to an alternate embodiment of the RF communications system.

FIG. 8 shows the RF communications system 100 according to an alternate embodiment of the RF communications system 100. The RF communications system 100 illustrated in FIG. 8 is similar to the RF communications system 100 illustrated in FIG. 7, except in the RF communications system 100 illustrated in FIG. 8, the RF transmitter circuitry 102 further includes a digital communications interface 112, which is coupled between the DC power supply 10 and a digital communications bus 114. The digital communications bus 114 is also coupled to the RF system control circuitry 104. As such, the RF system control circuitry 104 provides the power supply control signal VRMP (FIG. 7) to the DC power supply 10 via the digital communications bus 114. The DC power source 12 (FIG. 7) is not shown to simplify FIG. 8.

Those skilled in the art will recognize improvements and modifications to the preferred embodiments of the present disclosure. All such improvements and modifications are considered within the scope of the concepts disclosed herein and the claims that follow.

What is claimed is:
1. A Direct Current (DC) power supply comprising:
a DC-DC converter configured to:
provide a DC power supply signal to a load via a power supply output using a setpoint of the DC power supply; and
provide a duty-cycle signal that is a current signal based on a duty-cycle of the DC-DC converter, such that a magnitude of the duty-cycle signal is inversely related to the duty-cycle; and
a linear voltage regulator coupled to the power supply output and configured to:
receive the duty-cycle signal from the DC-DC converter;
provide an adjusted setpoint of the DC power supply using the setpoint and the duty-cycle signal, wherein the adjusted setpoint is directly related to the setpoint and directly related to the duty-cycle; and provide a DC assist signal to assist the DC-DC converter when the adjusted setpoint is within an assist range of the DC power supply signal.

2. The DC power supply of claim 1 wherein the linear voltage regulator comprises an open-drain output coupled to the power supply output, such that the linear voltage regulator is further configured to provide the DC assist signal via the open-drain output.

3. The DC power supply of claim 1 wherein the linear voltage regulator comprises an open-collector output coupled to the power supply output, such that the linear voltage regulator is further configured to provide the DC assist signal via the open-collector output.

4. The DC power supply of claim 1 wherein the linear voltage regulator comprises an error amplifier and a transistor element, such that the transistor element is coupled between the error amplifier and the power supply output, and the linear voltage regulator is further configured to provide the DC assist signal via the error amplifier and the transistor element.

5. The DC power supply of claim 4 wherein the linear voltage regulator further comprises a first resistive element and a second resistive element, wherein the first resistive element is coupled between an input to the error amplifier and the power supply output, and the second resistive element is coupled between the input to the error amplifier and ground.

6. The DC power supply of claim 4 wherein the error amplifier receives the duty-cycle signal via an input to the error amplifier.

7. The DC power supply of claim 1 wherein when the duty-cycle is less than a maximum duty-cycle, the adjusted setpoint is less than the setpoint.

8. The DC power supply of claim 7 wherein the maximum duty-cycle is equal to 100 percent.

9. The DC power supply of claim 7 wherein when the duty-cycle is equal to the maximum duty-cycle, the adjusted setpoint is equal to the setpoint.

10. The DC power supply of claim 1 wherein a DC power source is configured to provide a DC source signal, such that the DC-DC converter is further configured to use the DC source signal to provide the DC power supply signal and the linear voltage regulator is further configured to use the DC source signal to provide the DC assist signal.

11. The DC power supply of claim 10 wherein the DC power source is a battery.

12. The DC power supply of claim 10 wherein the DC source signal has a DC source voltage, such that when the DC source voltage minus the setpoint is greater than a voltage threshold, the DC-DC converter is further configured to disable the DC assist signal.

13. The DC power supply of claim 12 wherein the voltage threshold is greater than 350 millivolts.

14. The DC power supply of claim 1 wherein the DC-DC converter comprises:
 a converter error amplifier configured to provide an error signal based on a difference between a feedback signal and a power supply control signal; and
 a pulse-width modulation controller configured to provide the duty-cycle signal to the linear voltage regulator and provide a charge pump control signal, wherein:
  the power supply control signal is representative of the setpoint;
  the feedback signal is representative of the DC power supply signal; and
  the DC-DC converter is further configured to provide the DC power supply signal using the error signal.

15. The DC power supply of claim 14 wherein the DC-DC converter further comprises an error voltage clamping circuit coupled to the converter error amplifier and configured to receive the feedback signal and the power supply control signal to limit the difference between the feedback signal and the power supply control signal.

16. The DC power supply of claim 14 wherein the DC-DC converter further comprises a dithering clock generator configured to provide a clock signal to the pulse-width modulation controller, wherein the charge pump control signal is based on the clock signal and the dithering clock generator is further configured to dither a frequency of the clock signal to dither a frequency of the charge pump control signal.

17. The DC power supply of claim 1 wherein control circuitry is configured to provide the setpoint of the DC power supply using a power supply control signal.

18. The DC power supply of claim 17 further configured to provide power to a radio frequency (RF) power amplifier (PA) using the DC power supply signal.

19. The DC power supply of claim 18 wherein the RF PA is configured to receive and amplify an RF input signal to provide an RF transmit signal using the DC power supply signal.

* * * * *